US012652826B2

(12) United States Patent　　　　(10) Patent No.:　US 12,652,826 B2
Krebs et al.　　　　　　　　　　　　(45) Date of Patent:　　Jun. 9, 2026

(54) FIELD-EFFECT TRANSISTOR, AND METHODS FOR PRODUCTION

(71) Applicant: Robert Bosch GmbH, Stuttgart (DE)

(72) Inventors: Daniel Krebs, Aufhausen (DE); Dick Scholten, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 434 days.

(21) Appl. No.: 18/488,741

(22) Filed: Oct. 17, 2023

(65) Prior Publication Data

US 2024/0136435 A1　　Apr. 25, 2024
US 2024/0234568 A9　　Jul. 11, 2024

(30) Foreign Application Priority Data

Oct. 19, 2022　　(DE) ..................... 10 2022 211 041.2

(51) Int. Cl.
*H10D 30/66*　　　　(2025.01)
*H10D 30/01*　　　　(2025.01)
*H10D 30/60*　　　　(2025.01)
*H10D 62/10*　　　　(2025.01)

(52) U.S. Cl.
CPC ....... *H10D 30/668* (2025.01); *H10D 30/0297* (2025.01); *H10D 30/611* (2025.01); *H10D 62/107* (2025.01)

(58) Field of Classification Search
CPC ............. H10D 30/668; H10D 30/0297; H10D 30/611; H10D 12/031; H10D 62/157; H10D 62/314; H10D 62/8503
See application file for complete search history.

(56) References Cited

U.S. PATENT DOCUMENTS

| | | | |
|---|---|---|---|
| 12,376,319 B2 * | 7/2025 | Kim ..................... | H10D 12/481 |
| 2002/0060338 A1 * | 5/2002 | Zhang ................ | H10D 30/0321 257/E21.41 |
| 2017/0170298 A1 * | 6/2017 | Balakrishnan ......... | H10D 84/83 |
| 2019/0363166 A1 * | 11/2019 | Knoll ................... | H10D 62/393 |
| 2020/0098868 A1 * | 3/2020 | Ploss .................. | H10D 30/0297 |
| 2021/0043735 A1 * | 2/2021 | Minamisawa ........ | H01L 21/047 |
| 2021/0320170 A1 * | 10/2021 | De-Michielis ....... | H10D 12/481 |
| 2022/0190104 A1 * | 6/2022 | Zeng ................... | H10D 30/668 |
| 2022/0352315 A1 * | 11/2022 | Rahimo .............. | H10D 64/513 |

(Continued)

FOREIGN PATENT DOCUMENTS

DE　　　102020201997 A1　　8/2021

*Primary Examiner* — Mamadou L Diallo
(74) *Attorney, Agent, or Firm* — NORTON ROSE FULBRIGHT US LLP

(57)　　　　　　　ABSTRACT

A field-effect transistor. The field-effect transistor includes: a source layer doped according to a first type, a drain layer doped according to a first type, a channel layer located vertically between the source layer doped according to the first type and the drain layer doped according to the first type, and a gate trench which extends vertically from the source layer doped according to the first type to the drift layer doped according to the first type and adjoins the channel layer. The channel layer has, at least on average, a lower doping of the second type and a higher doping of the first type in a region that is more than a specified distance from the gate trench than in a region that is less than the specified distance from the gate trench. Methods for production are also described.

16 Claims, 6 Drawing Sheets

(56) References Cited

U.S. PATENT DOCUMENTS

| 2023/0021938 A1* | 1/2023 | Wong | H10D 30/668 |
| 2023/0098516 A1* | 3/2023 | Pala | H10D 30/831 |
| | | | 257/77 |
| 2024/0055514 A1* | 2/2024 | Pala | H10D 30/668 |

* cited by examiner

FIELD-EFFECT TRANSISTOR, AND METHODS FOR PRODUCTION

FIELD

The present invention relates to a field-effect transistor, in particular to a so-called trench MOSFET, and to methods for its production.

BACKGROUND INFORMATION

Field-effect transistors, in particular so-called MOSFETs, are used in various areas. One variant thereof is called trench MOSFETs or T-MOSFETs, in which a channel is formed vertically. In this case, an n-doped source layer and a channel layer located between it and an n-doped drift layer is penetrated by trenches; gate electrodes are then arranged in such trenches.

SUMMARY

According to the present invention, a field-effect transistor and methods for its production are provided. Advantageous embodiments of the present invention are disclosed herein.

The present invention relates to field-effect transistors, viz., in particular, with trenches, and to their production. Various types of doping, namely n-doping and p-doping, are used in semiconductor materials, wherein different components can be doped differently. For the sake of comprehensibility, field-effect transistors with a particular type of doping are to be described below; n-doping is to be a doping of a first type, p-doping is to be a doping of a second type. However, it is understood that n- and p-doping can also be interchanged, i.e., n-doping could be the doping of the second type and p-doping could be the doping of the first type.

According to an example embodiment of the present invention, a field-effect transistor comprises an n-doped source layer as well as an n-doped drain layer (in particular comprising an n-doped drift layer, e.g., applied as a so-called epitaxy layer or epitaxial layer). It also comprises a channel layer located vertically between the n-doped source layer and the n-doped drain layer. The channel layer may be p-doped. Furthermore, such a field-effect transistor has a gate trench which extends vertically from the n-doped source layer to the n-doped drain layer and adjoins the channel layer, thus in particular also passes through the channel layer.

Furthermore, the field-effect transistor can comprise a gate electrode which is arranged in the gate trench and is at least partially surrounded by a dielectric (e.g., so-called gate oxide), viz., in particular, in such a way that the gate electrode is thus isolated from the n-doped source layer, the channel layer, and the n-doped drain layer. The gate electrode can be formed as one piece or can be divided into at least two parts, viz., in such a way that a region of a bottom of the gate trench remains free. In this case, the MOSFET is also referred to as a so-called FinMOSFET. A p-doped shielding region can then be formed vertically below the gate trench, and thus in the n-doped drain layer. In the case of several gate trenches, such a p-doped shielding region may be present at each gate trench or, for example, only at each second gate trench. Without such a divided gate electrode, a p-doped shielding region can be formed next to one or between two gate trenches and extend from the n-doped source layer (including the height thereof) to, or into, the n-doped drain layer.

It should be noted that such a field-effect transistor typically has a multitude of such gate trenches and gate electrodes, to which then applies the same as to a gate trench explained above and to be explained below. It is understood that such a field-effect transistor comprises not only the gate electrodes but also source and drain terminals, which can be formed in a conventional manner. This is a particular advantage of a trench MOSFET since the vertical arrangement makes it possible to arrange many gate electrodes next to one another. The field-effect transistor can in particular be formed as a SiC or GaN field-effect transistor, i.e., a substrate and/or commonly used semiconductor material can be silicon carbide (SiC) or gallium nitride (GaN).

The switch-on resistance, threshold voltage, short-circuit resistance, oxide charge, and breakdown voltage in such a field-effect transistor can be optimized by appropriately selecting the geometry, epitaxial layer, and implanted or used dopings.

It has now been shown that, in such a FinMOSFET and in a conventional trench MOSFET, the pn diode at the transition between the p-doped shielding region and the n-doped drain or drift layer, due to its bipolar nature, can have high switching losses and, at high current densities, can cause crystal defects in the substrate. According to an example embodiment of the present invention, it has been found that this problem can be eliminated, or this effect can at least be reduced, in that the channel layer has, at least on average, a lower p-doping or a higher n-doping in a region that is more than a specified distance from the gate trench, e.g., more than 10 nm, than in a region that is less than the specified distance from the gate trench.

According to an example embodiment of the present invention, this region that is less than the specified distance from the gate trench and is thus, in particular, located directly at a border to the gate trench is a channel that typically becomes conductive by applying a voltage to the gate electrode. By decreasing the p-doping or increasing the n-doping in the channel layer at some distance from the channel zone, a current path through the channel layer is enabled at negative drain voltages. The current occurring in this case is a unipolar current and thus has only low switching losses and reduces the current density in the PN diode in the case of forced current since the two current paths are connected in parallel.

According to an example embodiment of the present invention, such a field-effect transistor can be used alone or together with further field-effect transistors, e.g., as a circuit breaker. Preferred areas of application are, for example, in an electric powertrain of a vehicle, e.g., in a current transformer (DC/DC converter, inverter) there, in charging devices for electrically operated vehicles, or also in solar inverters.

In addition to the field-effect transistor itself, the present invention also relates to methods for producing such a field-effect transistor, viz., in various preferred embodiments.

In a preferred embodiment of the present invention, a starting material is provided first, which comprises the following: an n-doped source layer, an n-doped drain layer, and a channel layer located vertically between the n-doped source layer and the n-doped drain layer. Optionally, the n-doped drain layer can comprise an n-doped drift layer and an n-doped spread layer which is located vertically between the channel layer and the n-doped drift layer and has a higher n-doping than the n-doped drift layer.

Furthermore, according to an example embodiment of the present invention, an n-doping is increased or a p-doping is reduced, viz., in the channel layer, and there in a doping region that is more than a specified distance of, for example, 10 nm from a gate region in which a gate trench is to be formed (later). This can, for example, be a so-called n-counter doping implantation; such an implantation partially compensates for the p-doping in the channel layer at a desired distance from the later side wall of the gate trench so that the resulting total doping is less p-doped there than in the channel region (i.e., directly or near the wall of the gate trench). The p-doping of the channel layer, in particular in the region of the channel, is optional, viz., in particular, to the extent that, in the case of a FinMOSFET, the channel zone can also remain n-doped since the fin is depleted at the substrate gate-oxide interface by a band bending.

Thereafter, the gate trench can at least partially be formed in the gate region; for example, depending on the variant, only a portion of the finally necessary gate trench can be formed first, e.g., by etching, and the full gate trench can then be formed later.

According to an example embodiment of the present invention, it is preferably provided to apply a mask to the n-doped source layer in the gate region prior to increasing the n-doping or reducing the p-doping, wherein a spacer layer extending to the doping region has been or is applied to side walls of the mask.

For example, the mask can comprise a corresponding covering portion for each gate trench to be formed. This mask together with the spacer layer then allows a simple increase of the n-doping or reduction of the p-doping in the desired doping region. The spacer layer can be selected so thick that the doping region has the desired distance of, for example, 10 nm from the gate trench.

In addition, according to an example embodiment of the present invention, preferably prior to at least partially forming the gate trench, the mask is inverted, wherein the spacer layer is retained, in order to form an inverted mask. The gate trench is then formed using the inverted mask with the spacer layer. Thus, where the increase of the n-doping or reduction of the p-doping has previously taken place, a covering portion is formed, whereas the covering portion is removed in the gate region. This allows the gate trench to be formed, at least partially, e.g., by etching.

According to an example embodiment of the present invention, preferably, prior to at least partially forming the gate trench, a p-doping is formed or increased in the gate region, in particular using the inverted mask with the spacer layer. The aforementioned, optional, p-doping of the channel layer is thus achieved. In particular by using the inverted mask, it is however achieved that the p-doping is not increased in the desired doping region.

Instead of the mask with inversion, it is however also possible, for example, for two lithography steps (with lithography masks) adjusted to one another to take place and for the reverse process (inversion of the mask) with the spacer layer (spacer) to be omitted. This has the advantage that the process is simpler and thus more cost-efficient; however, as a result, the process is no longer self-adjusted and is therefore associated with greater process variability.

Alternatively, according to an example embodiment of the present invention, it is preferred if, prior to increasing the n-doping or reducing the p-doping, the p-doping in the channel layer is formed or increased, viz., in particular, as a planar p-doping, i.e., for example, without a mask.

In this case as well, instead of the reverse process, two lithography steps (or lithography masks) for n- and p-implantation can be used. The advantage of this is that the implanted zones can be formed to overlap as a result, and more degrees of freedom in the selection of the implantation doses are thus achieved.

Advantageously, according to an example embodiment of the present invention, after at least partially forming the gate trench, a p-doped shielding region is formed in the n-doped drift layer at a bottom of the gate trench, in particular after previously forming a spacer layer on side walls of the gate trench. This allows the p-doped shielding region to be formed simply and purposefully.

In a further preferred embodiment of the present invention, a starting material is provided first, which comprises the following: an n-doped source layer, an n-doped drain layer comprising n-doped drift and spread layer, and a channel layer located vertically between the n-doped source layer and the n-doped drift layer. Here, the previously optional n-doped spread layer which is located vertically between the channel layer and the n-doped drift layer and has a higher n-doping than the n-doped drift layer is then provided.

Then, a gate trench is at least partially formed in a gate region, and an increase of a p-doping or reduction of an n-doping follows in the channel layer, viz., in an intermediate region extending from the gate region to a specified distance. This change of the doping takes place in particular via the at least partially formed gate trench, e.g., at a suitable angle to the side walls, i.e., in particular, for example, by an oblique implantation into the gate trench or an implantation that laterally spreads into the mesas (the implantation does not necessarily have to take place obliquely; lateral spreading is also possible in this case). Thus, in this case, the p-doping is not reduced (and the n-doping is not increased) in the doping region, but rather, reversely, the p-doping is increased (or the n-doping is reduced) in the intermediate region, i.e., the later channel or channel region. Suitable masks, if necessary with inversion of the mask, can also be used here.

According to an example embodiment of the present invention, irrespective of the specific order for doping and for forming the gate trench, after at least partially forming the gate trench, a gate electrode which is at least partially surrounded by a dielectric can be introduced into the gate trench, in particular after previously forming a spacer layer on side walls of the gate trench. This also applies accordingly to any further gate trenches. In so doing, the gate electrode can be divided into at least two parts in such a way that, upon introduction, a region of a bottom of the gate trench remains free; this thus applies to the mentioned FinMOSFET. Thereafter, the field-effect transistor can be metallized, in particular comprising: contacting a shielding structure at the end of a cell field or between the gate electrode divided into two parts.

It is understood that even further steps may be necessary for the final field-effect transistor, such as edge termination as well as contact path lead-throughs and the like; here, common methods can be used. The steps described above, on the other hand, relate in particular to the so-called cell field of the field-effect transistor in which the gate trenches are formed.

Further advantages and embodiments of the present invention emerge from the description and the figures.

The present invention is illustrated schematically in the figures on the basis of exemplary embodiments and is described below with reference to the figures.

DETAILED DESCRIPTION OF EXAMPLE EMBODIMENTS

Figures 1A, 1B:
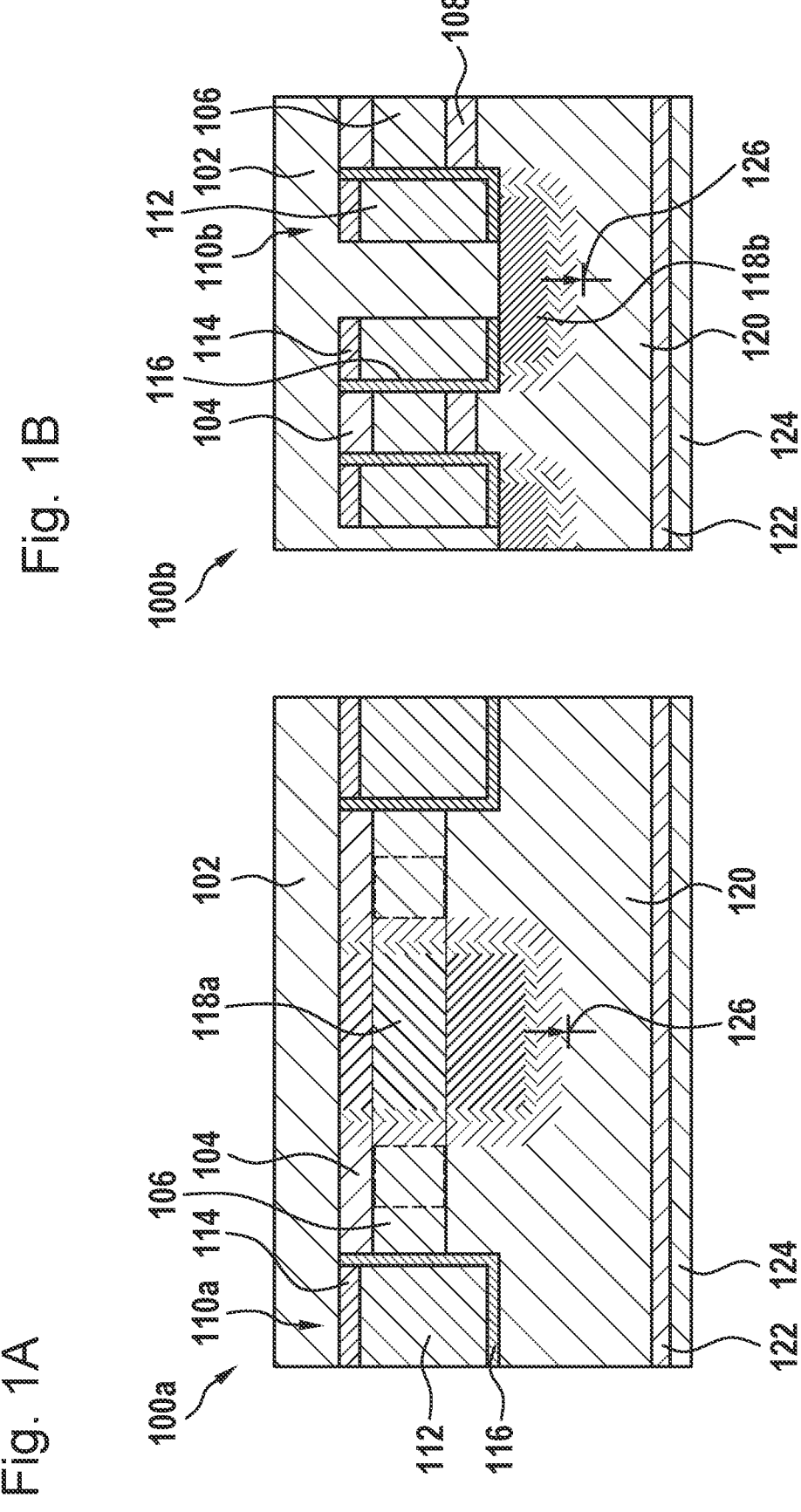
FIGS. 1A and 1B schematically show two field-effect transistors not according to the present invention.

FIGS. 1A and 1B schematically show two field-effect transistors not according to the present invention, viz., a so-called trench MOSFET 100a in FIG. 1A and a trench MOSFET 100b as a so-called FinMOSFET in FIG. 1B. The same elements in FIGS. 1A and 1B are designated the same and are also to be described comprehensively, first as a background to the present invention. Silicon carbide (SiC) or gallium nitride (GaN) can in particular be used as the semiconductor material since these semiconductor materials have a wide band gap.

The field-effect transistors 100a and 100b have an n-doped source layer 104, an n-doped drain layer comprising an n-doped drift layer or so-called epitaxy layer 120, and a channel layer 106 located vertically (viewed here from top to bottom) between the n-doped source layer 104 and the n-doped drain layer 120. The n-doped drain layer also has an n-doped spread layer 108 which is located vertically between the channel layer 106 and the n-doped drift layer 120 and has a higher n-doping than the n-doped drift layer 120.

Furthermore, the field-effect transistors 100a and 100b have a p-doped shielding region 118a and 118b, respectively. In the field-effect transistor 100a, the shielding region 118a extends from the height of the n-doped source layer 104 into the n-doped drain or drift layer 120. In the field-effect transistor 100b, the shielding region 118b is formed in the n-doped drain or drift layer 120.

Furthermore, by way of example, the field-effect transistors 100a and 100b each have several gate electrodes 110a and 110b, respectively. The gate electrodes 110a and 110b each have an insulation oxide 114 and a dielectric or a gate oxide 116, which surrounds a gate electrode 112. Via the dielectric 116, the gate electrode adjoins at least the channel layer 106. The gate electrodes serve to control a channel zone in the channel layer 106. For example, the gate electrodes are contacted in a conventional manner at the end of the cell field into the drawing plane by lead-through out of the gate trenches.

The gate electrode 110a completely fills a gate trench (not denoted). The gate electrode 110b, on the other hand, is divided into two parts and therefore does not completely fill a gate trench; rather, a source material 102, e.g., a metal which per se covers the n-doped source layer 104, extends through the two-part gate electrode 110b, or the intermediate space thereof, to the bottom of the gate trench, to the shielding region 118b.

Furthermore, the field-effect transistors 100a and 100b comprise an n-doped substrate 122 which adjoins the n-doped drift layer 120 at the bottom, and a drain material 124, e.g., a metal which adjoins the n-doped substrate 122 at the bottom. For this purpose, the n-doped drift layer may comprise a buffer layer, which represents the transition between the substrate and the n-doped drift layer. This buffer layer can, for example, be 3 μm thick and higher-doped than the n-doped drift layer.

In the field-effect transistors 100a and 100b, a pn diode 126 forms between the p-doped shielding region 118a and 118b, respectively, and the n-doped drift layer. As already mentioned, due to the bipolar nature of the pn diode, high switching losses occur here and, at high current densities, crystal defects can be caused in the substrate.

As already mentioned, in the field-effect transistor shown in FIGS. 1A and 1B, the n- and p-dopings can also be interchanged.

Figure 2:
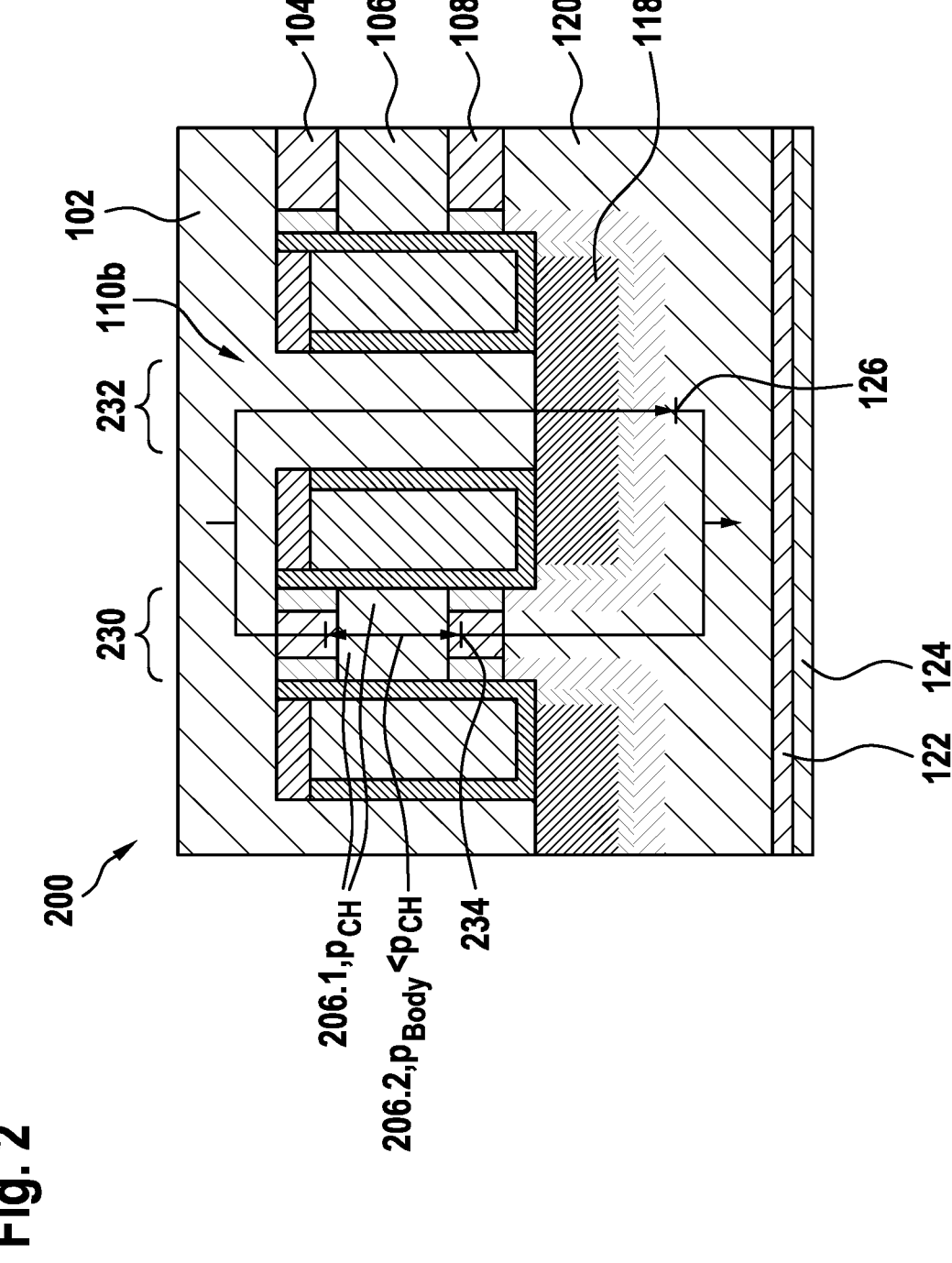
FIG. 2 schematically shows a field-effect transistor according to the present invention in a preferred embodiment.

FIG. 2 schematically shows a field-effect transistor 200 according to the present invention in a preferred embodiment. The structure here is in principle like that of the field-effect transistor 100b of FIG. 1B; the same elements are provided with the same reference signs so that reference can be made to the description there.

Here, the channel layer 106 is now formed in a region 206.2 that is more than a specified distance, e.g., 10 nm (but more than 5 nm or 15 nm or 20 nm are also possible), from the gate trench, and thus from the border between the gate oxide 116 and the channel layer 106, in such a way that it has, at least on average, a lower p-doping, denoted by $p_{channel}$, than in a region 206.1, i.e., the channel, that is less than the specified distance from the gate trench. There, the p-doping is denoted by $p_{CH}$ and $p_{channel} < p_{CH}$ applies. For example, the doping can decrease in a steplike manner here but expediently decreases continuously. What is ultimately in particular important is that the doping at the border between the gate electrode and the channel layer differs sufficiently from the doping further away. Here, for example, a difference in the doping of between 10% more and the quadruple can be considered.

It has been found that this problem can be eliminated, or this effect can at least be reduced, in that the channel layer has, at least on average, a lower p-doping or a higher n-doping in a region that is more than a specified distance from the gate trench, e.g., more than 10 nm, than in a region that is less than the specified distance from the gate trench.

Two current paths, which are drawn in FIG. 2, thus exist between the source (source material 102) and the drain (drain material 122). One current path goes via the conventional pn diode 126 and one current path goes through the npn transition 234 in the lower-doped region 206.2. These two current paths are connected in parallel and therefore add up.

Figure 3:
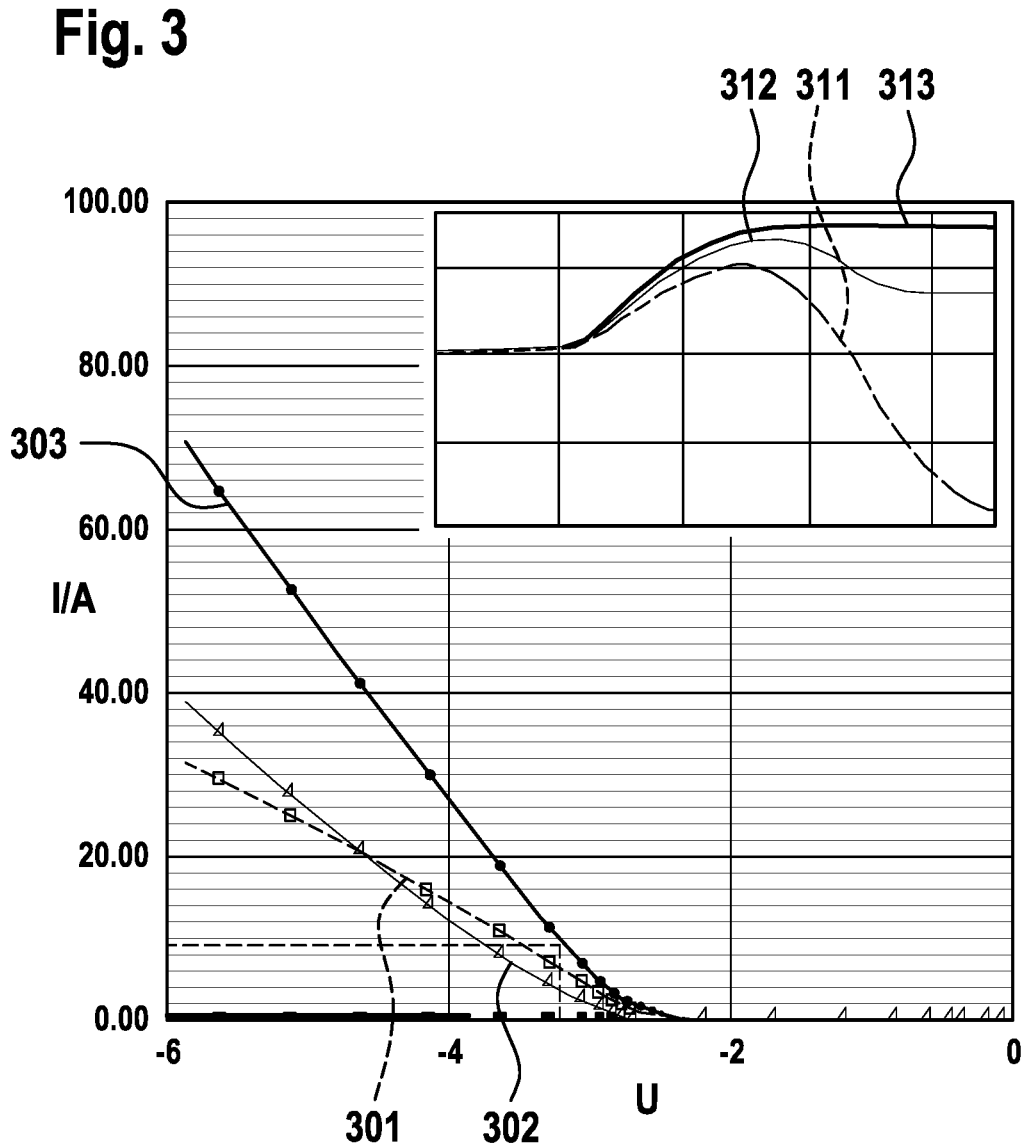
FIG. 3 schematically shows a diagram with current profiles.

In this respect, FIG. 3 schematically shows a diagram of current profiles with a drain current density I/A (in A/mm²) versus a drain voltage U (in V). The upper right side of the diagram shows associated potential profiles for a potential or barrier $\Phi_B$.

The right side of FIG. 3 shows the potential profile along the npn transition. At negative gate voltages (−5V here), the barrier $\Phi_B$ vanishes and a current can flow. By appropriately selecting the p-doping of the channel layer, the barrier can be set such that, at a desired operating point (e.g., approx. 9 A/mm²), the current through the npn transition in the channel layer dominates in order to in this way avoid too high bipolar currents and thus defect formation through the pn diode. Profile 301 corresponds to the current portion flowing through the npn transition in the channel layer. Profile 302 corresponds to the current portion flowing through the pn diode of the shielding structure, and profile 303 is the total current. At the operating point at approx. 9 A/mm$^2$, the current through the npn transition in the channel layer dominates.

Figure 4:
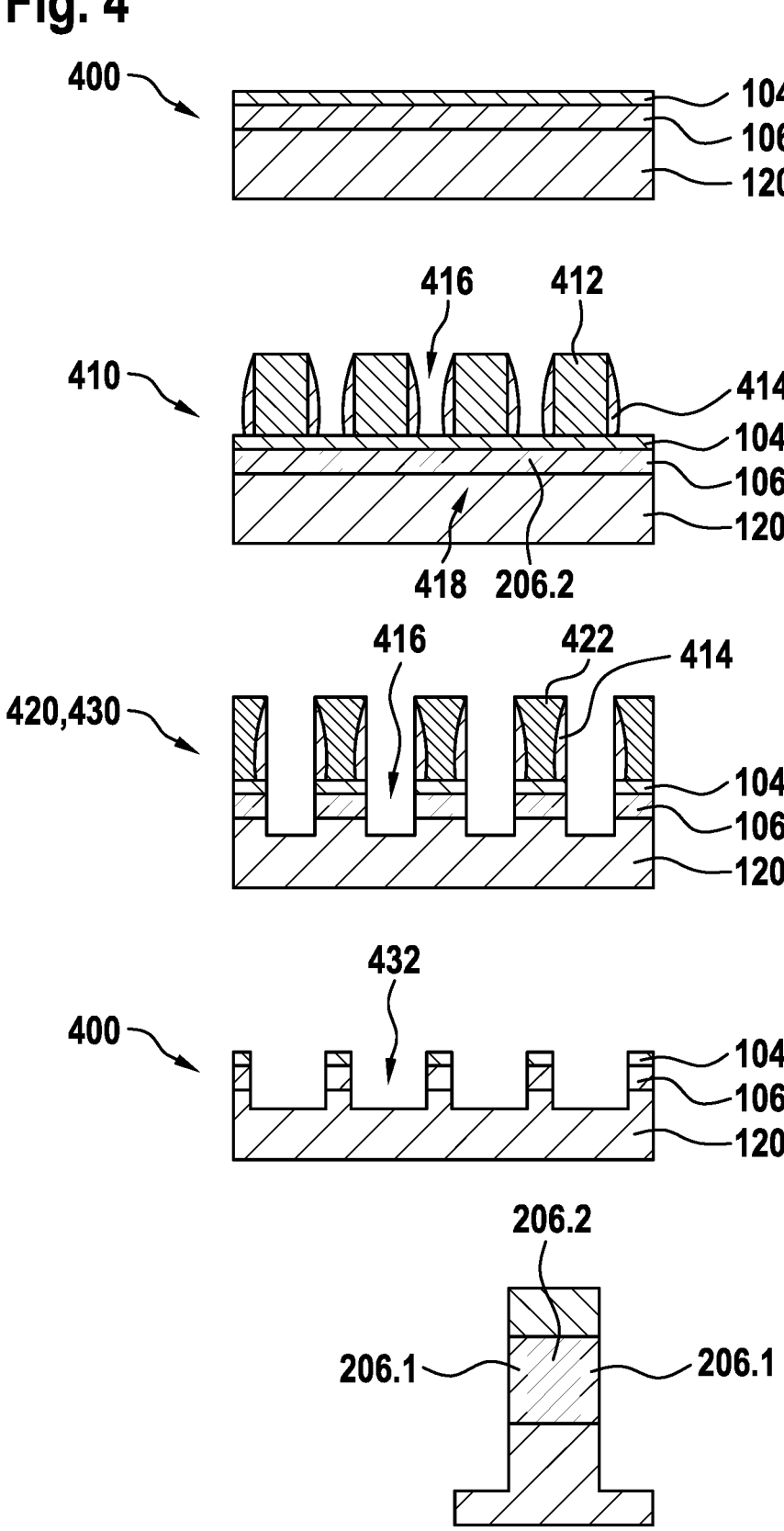
FIG. 4 schematically shows a sequence of a method according to the present invention in a preferred embodiment.

FIG. 4 schematically shows a sequence of a method according to the present invention in a preferred embodiment. It shows respective illustrations for various but not all steps.

In a step 400, a starting material is provided, which comprises an n-doped source layer 104, an n-doped drain layer comprising an n-doped drift layer 120, and a channel layer 106 located vertically between the n-doped source layer 104 and the n-doped drain layer. Optionally, the doped drain layer can comprise an n-doped spread layer that is located vertically between the channel layer 106 and the n-doped drift layer 120 and has a higher n-doping than the n-doped drift layer (which is however not shown here).

The channel layer 106 can be or become p-doped. For this purpose, a p-doping in the channel layer can be increased, viz., in particular planarly.

Then, an n-doping in the channel layer 106 is increased (or a p-doping is reduced), viz., in a doping region 206.2 that is more than a specified distance from a gate region 418 in which a gate trench is to be formed. To this end, a mask 412 is first applied to the n-doped source layer 104 in the gate region 418, for example in step 410, wherein a spacer layer 414 has been or is applied to side walls of the mask 412 and extends to the doping region 206.2.

An implantation of the n-counter doping, i.e., the increase of the n-doping or the reduction of the p-doping, can take place via free intermediate spaces 416 of the mask. The n-counter doping partially compensates for the p-channel doping at a distance of, for example, more than 10 nm to the later side wall of the gate trench so that the resulting total doping is less p-doped there than in the channel region.

In a step 420, the mask can then be inverted, wherein spacer layer 414 is retained, in order to form an inverted mask 422. For this purpose, the parts of the mask 412 can, for example, be etched away. In a step 430, a gate trench 432 is then at least partially formed using the inverted mask with the spacer layer. This can take place by etching, for example.

In a step 440, the gate trench can then still be adapted in such a way that a gate electrode divided into at least two parts can be introduced. This can, for example, take place by cyclic SiC oxidation and etching of the thus produced SiC oxide. It is advantageous to broaden the trench later since, firstly, sublithographic fin widths are possible in this way and, secondly, the side surface of the trenches can be cleaned by the broadening step and, thirdly, the distance between a potential implantation into the trenches after trench formation and the fin side wall can be set purposefully.

This achieves that the channel layer 106 has, at least on average, a lower p-doping or a higher n-doping in the region 206.2 that is more than a specified distance from the gate trench 432 than in a region 206.1 (the channel) that is less than the specified distance from the gate trench.

Still further steps can follow in order to finish the field-effect transistor, such as insertion of the gate electrodes, formation of contacts, and a metallization, as, for example, the application of drain and source material as shown in FIGS. 1A, 1B, and 2.

Figure 5:
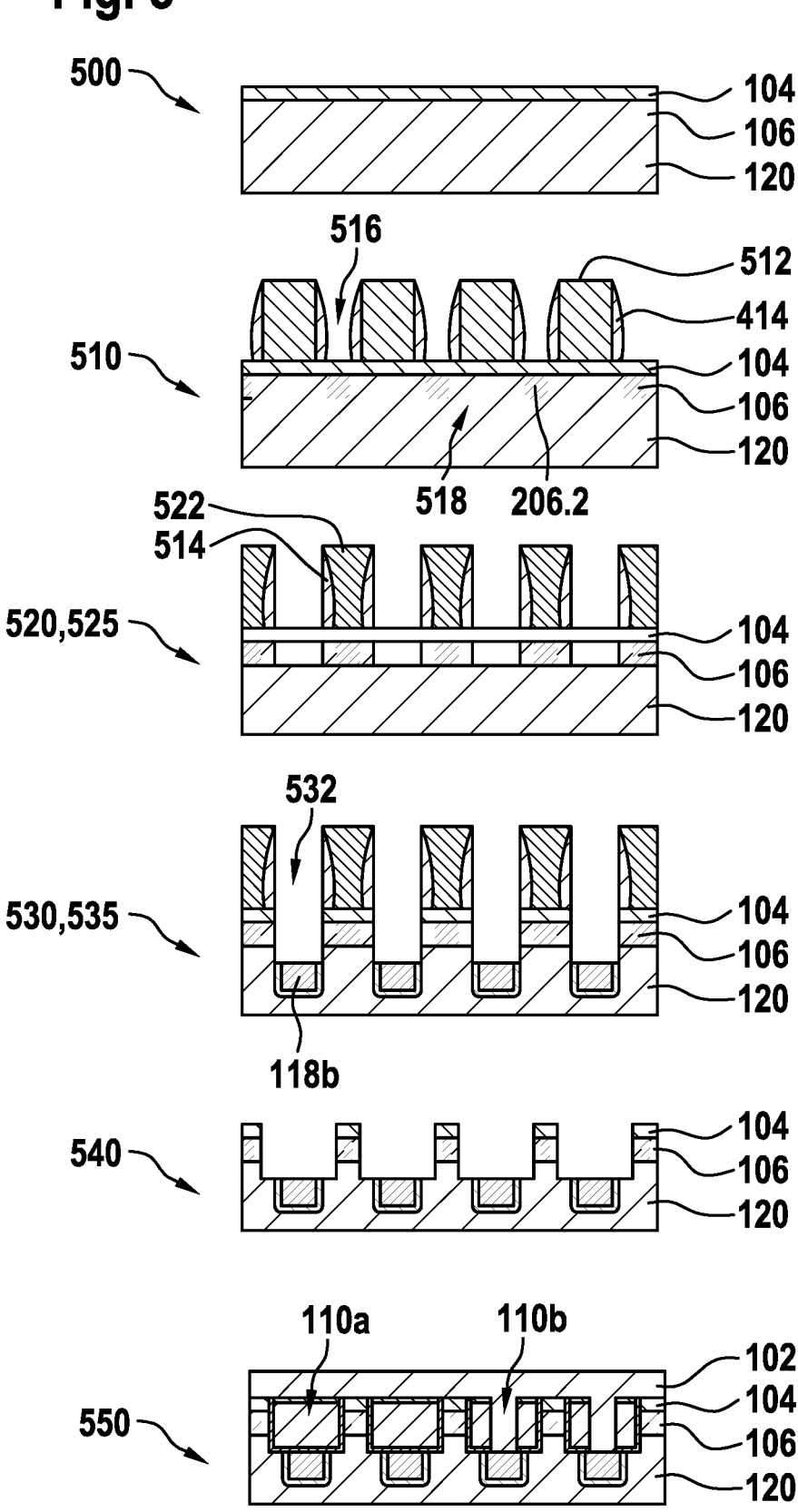
FIG. 5 schematically shows a sequence of a method according to the present invention in a further, preferred embodiment.

FIG. 5 schematically shows a sequence of a method according to the present invention in a further, preferred embodiment. It shows respective illustrations for various but not all steps.

In a step 500, a starting material is provided, which comprises an n-doped source layer 104, an n-doped drain layer comprising an n-doped drift layer 120, and a channel layer 106 located vertically between the n-doped source layer 104 and the n-doped drain or drift layer 120. Here, the channel layer 106 initially cannot be distinguished from the n-doped drift layer 120 since a change in the doping has not yet been made.

Then, an n-doping in the channel layer 106 is increased (or a p-doping is reduced), viz., in a doping region 206.2 that is more than a specified distance from a gate region 518 in which a gate trench is to be formed. To this end, a mask 512 is first applied to the n-doped source layer 104 in the gate region 518, for example in step 510, wherein a spacer layer 514 has been or is applied to side walls of the mask 512 and extends to the doping region 206.2.

An implantation of the n-counter doping, i.e., the increase of the n-doping or the reduction of the p-doping, can take place via free intermediate spaces 516 of the mask. The n-counter doping partially compensates for the p-channel doping at a distance of, for example, more than 10 nm to the later side wall of the gate trench so that the resulting total doping is less p-doped there than in the channel region.

In a step 520, the mask can then be inverted, wherein the spacer layer 514 is retained, in order to form an inverted mask 522. For this purpose, the parts of the mask 412 can, for example, be etched away.

In a step 525, a p-doping in the gate region 518 is then increased, viz., in particular, using the inverted mask 512 with the spacer layer 514. In this way, the channel layer 106 is developed with the desired doping. This can, for example, take place at an angle of 0° to the surface normal (wafer surface normal) or also at a tilt (e.g., at an angle of 7°).

In a step 530, a gate trench 532 is then at least partially formed using the inverted mask with the spacer layer. This can take place by etching, for example.

In a step 535, a spacer layer can optionally be deposited in the at least partially formed gate trench. This can be used to set the distance between the trench side wall and the p-doped shielding region 118b and to prevent dopants from spreading into the trench side wall during a subsequent implantation into the trench. Then, a p-doped shielding region 118b can be formed in the n-doped drift layer 120 at a bottom of the gate trench 532.

In a step 540, the gate trench can then still be adapted in such a way that a gate electrode divided into at least two parts can be introduced.

This achieves that the channel layer 106 has, at least on average, a lower p-doping or a higher n-doping in the region 206.2 that is more than a specified distance from the gate trench 532 than in a region 206.1 (the channel) that is less than the specified distance from the gate trench.

In step 550, the gate electrodes are then introduced. By way of example, the gate electrodes 110a as well as the divided gate electrodes 110b are shown.

Still further steps can follow in order to finish the field-effect transistor, such as formation of contacts and a metallization, as, for example, the application of drain and source material as shown in FIGS. 1A, 1B, and 2. By way of example, the source material 102 is shown here.

Figure 6:
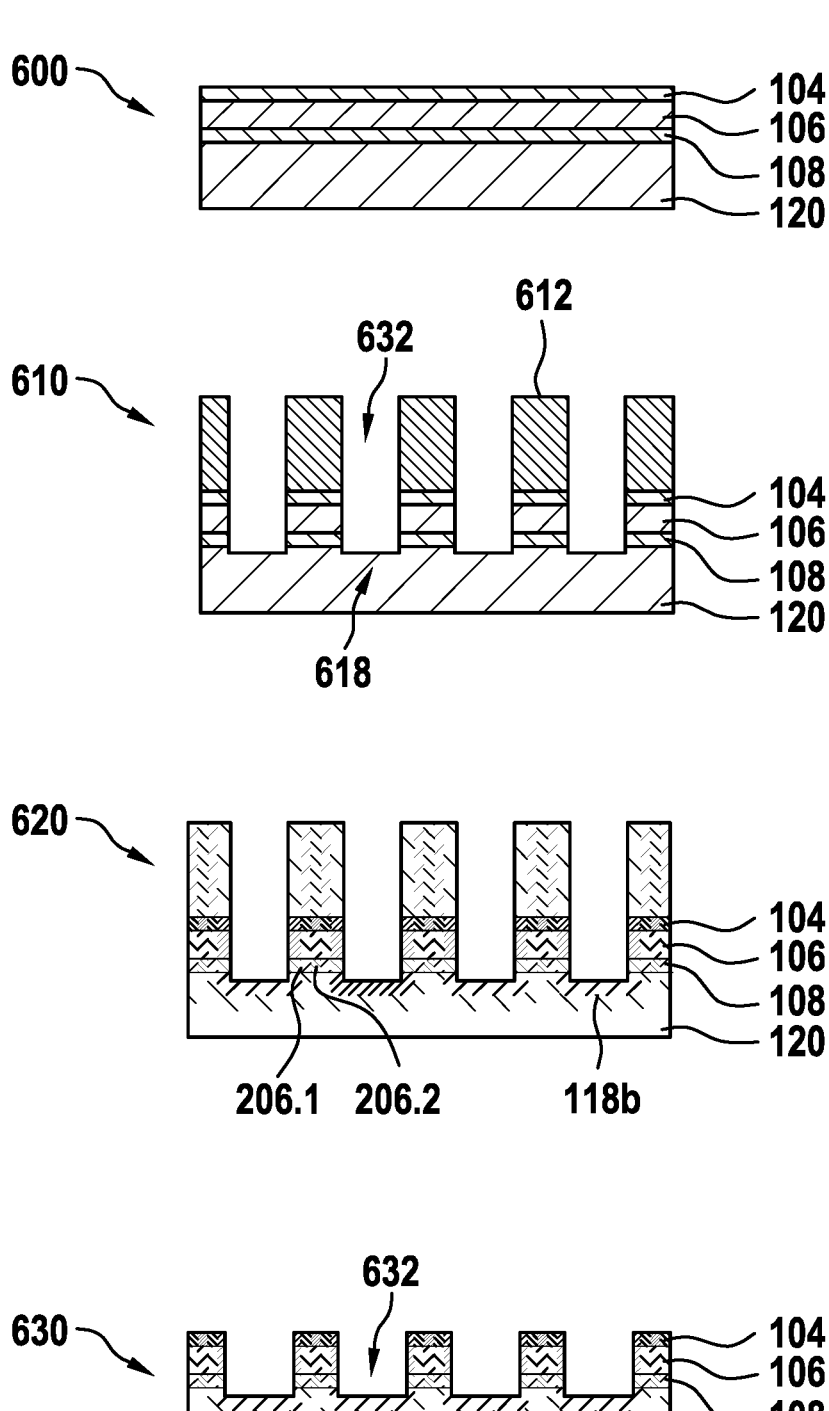
FIG. 6 schematically shows a sequence of a method according to the present invention in a further, preferred embodiment.

FIG. 6 schematically shows a sequence of a method according to the present invention in a further, preferred embodiment. It shows respective illustrations for various but not all steps.

In a step 600, a starting material is provided, which comprises an n-doped source layer 104, an n-doped drain layer comprising an n-doped drift layer 120 and an n-doped spread layer 108, and a channel layer 106 located vertically between the n-doped source layer 104 and the n-doped layer 108. The n-doped spread layer 108 which is located vertically between the channel layer 106 and the n-doped drift layer 120 has a higher n-doping than the n-doped drift layer.

The channel layer 106 can be or become p-doped. For this purpose, a p-doping in the channel layer can be increased, viz., in particular planarly.

Then, a gate trench 632 is at least partially formed in a gate region 618. To this end, a mask 612 can first be applied to the n-doped source layer 104 outside of the gate region 618, for example in step 610. This can take place by etching, for example.

Then, in step 620, a p-doping in the channel layer 106 is increased (or an n-doping is reduced), viz., in an intermediate region 206.1 extending from the gate region 618 to a specified distance, viz., in particular, to the doping region 206.2. This intermediate region 206.1 later (at least partially) forms the channel. This doping or implantation can, in particular, take place via the at least partially formed gate trench 632.

During an increase in the p-doping in the channel layer 106 performed in this way, a shielding region 218*b* can simultaneously be at least partially formed, viz., at the bottom of the gate trench 632 in the n-doped drift layer 120. This implantation can, for example, take place at an angle of 0° or at 7° or other angles, if necessary while rotating the wafer.

In a step 630, the mask can then be removed, and the gate trench can still be adapted in such a way that a gate electrode divided into at least two parts can be introduced.

This achieves that the channel layer 106 has, at least on average, a lower p-doping or a higher n-doping in the region 206.2 that is more than a specified distance from the gate trench 432 than in a region 206.1 (the channel) that is less than the specified distance from the gate trench.

Still further steps can follow in order to finish the field-effect transistor, such as insertion of the gate electrodes, formation of contacts, and a metallization, as, for example, the application of drain and source material as shown in FIGS. 1A, 1B, and 2.

Optional procedures in the production in this variant are, for example, a p-channel doping (i.e., p-doping of the channel layer) before or after the formation of the gate trench (trench etching). A spacer layer (spacer) can also be deposited after the channel doping, and the p-shield doping can then be made with the spacer layer in order to reduce the lateral extent of the shielding region (this is not the case in FIG. 6).

All described variants of production can be used not only in the FinMOSFET but also in the trench MOSFET. In this case, the p-channel zone (i.e., a region of the channel layer) between the channel and the p-doped shielding zone is, for example, doped lower by the above route than the channel. This is shown in FIG. 1A with a dashed frame.

The invention claimed is:

1. A field-effect transistor, comprising:
 a source layer doped according to a first type;
 a drain layer doped according to the first type;
 a channel layer located vertically between the source layer doped according to the first type and the drain layer doped according to the first type; and
 a gate trench which extends vertically from the source layer doped according to the first type to the drain layer doped according to the first type and adjoins the channel layer;
 wherein the channel layer has, at least on average, a lower doping of a second type or a higher doping of the first type in a region that is more than a specified distance from the gate trench than in a region that is less than the specified distance away from the gate trench.

2. The field-effect transistor according to claim 1, further comprising a gate electrode which is arranged in the gate trench and is divided into at least two parts in such a way that a region of a bottom of the gate trench remains free.

3. The field-effect transistor according to claim 1, wherein the channel layer is doped according to the second type.

4. The field-effect transistor according to claim 1, further comprising a shielding region doped according to the second type and located vertically below the gate trench in the drain layer doped according to the first type.

5. The field-effect transistor according to claim 1, wherein the field-effect transistor is a SiC or GaN field-effect transistor.

6. A method for producing a field-effect transistor, comprising the following steps:
 providing a starting material including: a source layer doped according to a first type, a drain layer doped according to the first type, and a channel layer located vertically between the source layer doped according to the first type and the drain layer doped according to the first type;
 increasing a doping of the first type or reducing a doping of the second type in the channel layer in a doping region that is more than a specified distance from a gate region in which a gate trench is to be formed; and
 at least partially forming the gate trench in the gate region so that the gate trench extends vertically from the source layer doped according to the first type to the drain layer doped according to the first type and adjoins the channel layer.

7. The method according to claim 6, further comprising, prior to increasing the doping of the first type or reducing the doping of the second type:
 applying, onto the source layer doped according to the first type, a mask in the gate region, wherein a spacer layer has been or is applied to side walls of the mask and extends to the doping region.

8. The method according to claim 7, further comprising, prior to at least partially forming the gate trench: inverting the mask, wherein the spacer layer is retained to form an inverted mask, and wherein at least partially forming the gate trench takes place using the inverted mask with the spacer layer.

9. The method according to claim 8, further comprising, prior to at least partially forming the gate trench: forming or increasing a doping of the second type in the gate region, using the inverted mask with the spacer layer.

10. The method according to claim 6, further comprising, prior to increasing the doping of the first type or reducing the doping of the second type: forming or increasing a doping of the second type in the channel layer, as a planar doping of the second type.

11. The method according to claim 6, further comprising, after at least partially forming the gate trench: forming a shielding region doped according to the second type in the drain layer doped according to the first type at a bottom of the gate trench, after previously forming a spacer layer on side walls of the gate trench.

12. The method according to claim 6, wherein the drain layer doped according to the first type includes a drift layer doped according to the first type and a spread layer doped according to the first type.

13. The method according to claim 6, further comprising, after at least partially forming the gate trench: introducing a gate electrode, which is at least partially surrounded by a dielectric, into the gate trench, after previously forming a spacer layer on side walls of the gate trench.

14. The method according to claim 13, wherein the gate electrode is divided into at least two parts in such a way that, upon introduction, a region of a bottom of the gate trench remains free.

15. The method according to claim 14, further comprising, after introduction of the gate electrode: metallizing, including contacting a shielding structure at an end of a cell field or between the gate electrode divided into two parts.

16. A method for producing a field-effect transistor, comprising the following steps:

providing a starting material including: a source layer doped according to a first type, a drain layer doped according to the first type and including a drift layer doped according to the first type and a spread layer doped according to the first type, a channel layer located vertically between the source layer doped according to the first type and the drain layer doped according to the first type, wherein the spread layer doped according to the first type is located vertically between the channel layer and the drift layer doped according to the first type, and has a higher doping of the first type than the drift layer doped according to the first type;

at least partially forming a gate trench in a gate region so that the gate trench extends vertically from the source layer doped according to the first type to the drain layer doped according to the first type and adjoins the channel layer; and increasing a doping of a second type or reducing a doping of the first type in the channel layer in an intermediate region extending from the gate region to a specified distance, through implantation, into the gate trench.

* * * * *